(12) United States Patent
Murai

(10) Patent No.: US 7,036,385 B2
(45) Date of Patent: May 2, 2006

(54) PRESSURE SENSOR AND RELATED METHOD

(75) Inventor: Tarou Murai, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/077,000

(22) Filed: Mar. 11, 2005

(65) Prior Publication Data

US 2005/0204823 A1     Sep. 22, 2005

(30) Foreign Application Priority Data

Mar. 19, 2004   (JP)   .............................. 2004-079669

(51) Int. Cl.
    *G01L 7/00*      (2006.01)

(52) U.S. Cl. ...................................................... 73/756

(58) Field of Classification Search ................. 73/706, 73/715–728, 756; 29/629.1, 25.41, 25.42
    See application file for complete search history.

(56) References Cited

U.S. PATENT DOCUMENTS 5,174,014 A * 12/1992 Erichsen et al. ........... 29/621.1
6,126,901 A * 10/2000 Patch et al. ................... 422/64
6,813,953 B1 * 11/2004 Baba et al. ................... 73/715

* cited by examiner

*Primary Examiner*—William Oen
(74) *Attorney, Agent, or Firm*—Posz Law Group, PLC

(57) ABSTRACT

A pressure sensor and related manufacturing method are disclosed wherein a connector case 10 is coupled to a housing 30 in a unitary structure. The connector case 10 includes a primary resin section 101 that enfolds and seals a terminal 12 while fixedly supporting a capacitor 16 on the terminal 12. The primary resin section 101 is encompassed by a secondary resin section 102 so as to enfold and seal the primary resin section 101 such that both ends of the terminal 12 are exposed to an outside. In one aspect, the primary resin section 101 enfolds and seals the capacitor and the terminal. In another aspect, the primary resin section 101 enfolds and seals the terminal and is formed with fixing portions 101a, 10ab, 101c by which the capacitor is fixedly supported on the terminal.

19 Claims, 5 Drawing Sheets

PRESSURE SENSOR AND RELATED METHOD

CROSS REFERENCE TO RELATED APPLICATIONS

This application is related to Japanese Patent Application No. 2004-79669 filed on Mar. 19, 2004, the content of which is hereby incorporated by reference.

BACKGROUND OF THE INVENTION

1. Field of the Invention

The present invention relates to pressure sensors and, more particularly, to a pressure sensor wherein a detector element, which detects a pressure, and a terminal, through which the detector is connected to an external circuit, which is connected by wire bonding and wherein the detector element is sealed by a diaphragm by means of oil.

2. Description of the Related Art

In recent years, due to electronic equipments use of digital technology, serious issues have arisen from electromagnetic waves at various frequencies adversely affecting other electronic equipment.

More particularly, probabilities occur wherein electronic equipment is adversely affected with the magnetic waves radiated from other electronic equipment, resulting in failures such as degraded functions, erroneous operations and unintended shutdowns. This is because the electromagnetic waves, taken into electronic equipment, serve as noises that cause failures to occur in internal parts of electronic equipment.

A pressure sensor, adapted to be installation on a vehicle, forms one part of electronic equipment that is susceptible to adverse affects caused by the electromagnetic waves. In particular, the electromagnetic waves, radiated from electronic devices such as an ECU installed on the vehicle, transfer through wirings, to which the pressure sensor is connected, and enter the pressure sensor, causing failures. To address such issues, it is highly required for the pressure sensor to be protected from such noises.

As measures to address the noises described above, it is conceived that capacitors are electrically connected to terminals of the pressure sensor to allow noises, inputted through the terminals, to transfer to a ground terminal for thereby outputting the noises to an outside of the pressure sensor. Such measures are deemed to be advisable for the capacitors, placed on the terminals, to block the noises admitted through the wirings to prevent the noises from entering the pressure sensor.

Therefore, various research and development work has heretofore been undertaken by the present inventors to provide and study prototypes of a structure in which the capacitors are placed on the terminals in a manner described above. One of such exemplary structures includes a connector case, with capacitors placed on terminals, which is shown in FIGS. 6A to 6C.

FIGS. 6A to 6C are views for illustrating a method of manufacturing a connector case of a pressure sensor wherein the capacitors 16 are placed on a position between the terminals 12a and 12b and a position between the terminals 12b and 12c.

As shown in FIGS. 6A and 6B, first, the terminals 12a to 12c are molded with resin to form a primary molded section 101 in a manner to hold the terminals 12a to 12c. More particularly, first, press forming is executed on a sheet of metal to form a terminal component 121 having three terminals 12 involving a power supply terminal 12a, a signal output terminal 12b and a ground terminal 12c. The terminal component 121, formed in such a structure, has bar portions through which the respective terminals 12a to 12c are integrally connected.

Then, a given area of the terminal component 121 is molded with resin, such as polyphenilene sulfide, to form the primary molded section 101 (in primary molding step). That is, the terminal component 121 is set in a molding die, to which melted resin is poured and hardened to form the primary molded section 101 of resin on the terminal component 121. Subsequently, the bar portions, through which the respective terminals 12 are connected, are cut out. This causes the terminals 12 to be electrically disconnected. Then, the capacitors (for instance, ceramic capacitors) 16 are connected to the associated terminals 12 by welding. More particularly, as shown in FIG. 6A, wirings 16a of the capacitors 16 are welded to and connected between the terminals 12a and 12b and between the terminals 12b and 12c.

Next, the primary molded section 101 is molded with resin to form a secondary molded section 102 serving as a connector case 10. That is, as shown in FIG. 16C, the terminals 12, resulting from the primary molding step shown in FIGS. 6A and 6B, are set in a molding die of the connector case 10 and melted resin is poured into the molding die through resin pouring ports 103, shown in FIG. 6C, thereby forming a secondary molded section 102 (in secondary molding step) serving as the connector case 10. In such a manner, the connector case 10 in which the capacitors 16 are incorporated is completed.

Thus, connecting the capacitors to the associated terminals and forming the primary and secondary molded sections of resin enables the connector case 10, incorporating the capacitors 16, to be formed.

However, if the capacitors 16 are connected to the associated terminals 12, respectively, as shown in FIGS. 6A and 6B, melted resin is caused to rush into the molding die of the connector case 10 with a great force from the resin pouring ports 103 shown in FIG. 6C and, due to such rushing flow of resin, issues arise with a tendency wherein the capacitors 16 are dislocated from the associated terminals 12.

More particularly, with melted resin poured through the resin pouring ports 103 into the molding die, melted resin introduced from the resin pouring ports 103 passes across the capacitors 16 and flows in a direction toward distal ends of the terminals 12. Due to such flow of melted resin, the capacitors 16 suffer from stresses such that the capacitors 16 are forced toward the distal ends of the terminals 12. That is, the capacitors 16 are pulled and pushed down in a direction opposing to the flow of resin. When this takes place, the capacitors 16 are pushed in a direction toward the distal ends of the terminals 12 and lead wires 16a are twisted, causing welded portions of the lead wires 16a to be torn off from the associated terminals 12. This results in electrically disconnected conditions between the capacitors 16 and the terminals 12.

To address such issues, it is conceived that the lead wires 16a of the capacitors 16 are welded to the associated terminals 12 in an area near an interior of the pressure sensor, as viewed in FIGS. 6A and 6B, at positions of close proximity to the primary molded section 101 upon which the capacitors 16 are pulled down in a direction wherein resin flows. With such a measure, it is considered that no lead wires 16a of the capacitors 16 tend to be torn away from the associated terminals due to the stresses caused by the flow of resin and the capacitors 16 are deemed to resist the flow of melted resin during the formation of the secondary molded section 102. However, the presence of the primary molded section 101 with an increased height provides disturbances with the resultant difficulty in welding the lead wires 16a to the associated terminals at positions closer to the primary molded section 101. Thus, it becomes difficult for the lead wires 16a of the capacitors 16 to be welded to the associated terminals at positions closer to the primary molded section 101 near the interior of the pressure sensor.

SUMMARY OF THE INVENTION

The present invention has been completed with the above issues in mind and has an object to provide a pressure sensor and a related manufacturing method that can protect capacitors from tearing off from a terminal during a molding process of a connector case.

To achieve the above object, according to one aspect of the present invention, there is provided a pressure sensor comprising a connector case carrying thereon an electrically conductive terminal, a housing adapted to be supplied with a pressure to be detected and fixedly carrying thereon the connector case, a capacitor supported by the connector case and connected to the terminal to allow noises, inputted through the terminal, to be outputted to an outside, and a sensor section mounted to the connector case at one end thereof for detecting the pressure introduced to the housing to deliver a pressure detection signal through the terminal. The connector case includes a primary resin section, fixedly supporting the capacitor and the terminal, and a second resin section by which a joint area between the terminal and the capacitor and the primary resin section are enfolded and sealed.

With such a structure, the primary resin section fixedly supports the capacitor such that the capacitor is not susceptible to stresses caused by the flow of resin in a molding die during the formation of the secondary resin section. Accordingly, no probabilities occur for lead wires of the capacitor to be twisted by the stresses imposed on the capacitor during the formation of the secondary molded section, thereby protecting welded portions between the lead wires and the terminal from damage. This makes it possible for the capacitor, connected to the terminal, to deliver noise, inputted to the pressure sensor, to the outside of the pressure sensor. This results in a capability of protecting an interior of the pressure sensor, that is, the sensor section from being adversely affected by the noise.

According to another aspect of the present invention, the secondary resin section is formed in a substantially cylindrical shape, and the capacitor and the terminal are enfolded and sealed in the primary resin section in a way to allow both ends of the terminal to be exposed outside.

With such a structure, the cylindrical secondary resin section makes it easy to assemble the connector case and the housing at low cost. Further, due to the formation of the primary resin section to enfold and seal the capacitor and the terminal, the capacitor can be fixedly secured in the primary resin section in a highly reliable manner, thereby protecting the capacitor from suffering from stresses caused by the flow of resin during the formation of the secondary resin section.

According to another aspect of the present invention, the secondary resin section is formed in a substantially cylindrical shape. Further, the terminal is enfolded and sealed in the primary resin section in a way to allow both ends of the terminal to be exposed outside.

With such a structure, the cylindrical secondary resin section provides the ease of assembling the connector case and the housing at low costs. Further, due to the formation of the primary resin section to enfold and seal the terminal while fixedly supporting the capacitor, the terminal is fixedly secured in the primary resin section while the primary resin section fixedly supports the capacitor. This allows the secondary resin section to be reliably formed without causing the capacitor from tearing off from the terminal. Thus, a highly reliable connector case can be obtained.

According to another aspect of the present invention, the first resin section has a plurality of fixing elements extending toward the capacitor to hold the same in a fixed place on the terminal.

With such a structure, the fixing elements of the primary resin section fixedly support the capacitor in a reliable manner, enabling the secondary resin section to enfold and seal the capacitor and the terminal without causing the capacitor to tear off from the terminal. Thus, a highly reliable connector case is obtained.

According to another aspect of the present invention, the fixing elements include protrusions extending from the first resin section at positions adjacent the capacitor, respectively.

The presence of the protrusions provides the primary resin section in a simplified structure with no increase in costs, while enabling the capacitor to be reliably supported on the terminal by the primary resin section.

According to a further aspect of the present invention, the fixing elements include struts extending from the first resin section at positions adjacent the capacitor.

The presence of the struts provides the primary resin section in a simplified structure with no increase in costs, while enabling the capacitor to be reliably supported on the terminal by the primary resin section.

According to a further aspect of the present invention, the terminal has a fixing portion by which the capacitor is held in a fixed place.

With such a structure, the terminal has the fixing portion and, hence, a molding die for molding the primary resin section is formed in a simplified structure, resulting in reduction in costs.

According to a further aspect of the present invention, the fixing portion includes a concave portion on which the capacitor rests and is held in a fixed place.

With such a structure, the concave portion of the terminal can be formed during press forming the terminal, resulting in reduction in costs.

According to a further aspect of the present invention, a diaphragm is disposed between the one end of the connector case and the housing and having one surface, exposed to the pressure applied to the housing, and the other surface facing the sensor section to apply the pressure thereto.

With such a structure, the sensor section is protected by the diaphragm and able to operate in a reliable manner in an extended period of time.

According to a further aspect of the present invention, a pressure detection chamber is exposed to the other surface of the diaphragm and a pressure transfer medium is filled in the pressure detection chamber to transfer the pressure, applied to the diaphragm, to the sensor section.

With the pressure transfer medium filled in the pressure detection sensor, the pressure exerted to the housing is effectively transferred to the sensor section via the pressure transfer medium, resulting in reliable operation of the sensor section.

According to a further aspect of the present invention, the sensor section is mounted to the one end of the connector member and exposed to the pressure transfer medium, and the terminal has one end exposed to the pressure detection chamber and electrically connected to the sensor section.

With such a structure, electrical connection between the terminal and the sensor section can be made in a simplified manner, resulting in reduction of the connector case.

According to a still further aspect of the present invention, there is provided a pressure sensor comprising a connector case carrying thereon an electrically conductive terminal, housing means adapted to be supplied with a pressure to be detected and fixedly carrying thereon the connector case, capacitor means supported by the connector case and connected to the terminal to allow noises, inputted through the terminal, to be outputted to an outside, and sensor means mounted for detecting the pressure introduced to the housing means to deliver a pressure detection signal through the terminal. The connector case includes a primary resin section, fixedly supporting the capacitor means and the terminal, and a second resin section by which the primary resin section is enfolded and sealed.

With such a structure, the primary resin section fixedly holds the capacitor such that the capacitor is not susceptible to stresses caused by the flow of resin in a molding die during the formation of the secondary resin section. Accordingly, no probabilities occur for lead wires of the capacitor to be twisted by the stresses imposed on the capacitor during the formation of the secondary molded section, thereby protecting welded portions between the lead wires and the terminal from damages. This makes it possible for the capacitor, connected to the terminal, to deliver noises, inputted to the pressure sensor, to the outside of the pressure sensor in a reliable manner.

According to a still further aspect of the present invention, there is provided a method of manufacturing a pressure sensor, which method comprises preparing a metallic terminal, connecting a capacitor to the terminal for allowing noises, inputted from the terminal, to be outputted to an outside, forming a primary resin section such that the capacitor and the terminal are fixedly supported, and forming a secondary resin section to enfold and seal the primary resin section and a joint area between the terminal and the capacitor such that both ends of the terminal are exposed.

With such a manufacturing method, holding the terminal with the primary resin section while fixedly supporting the capacitor on the terminal enables the second resin section to be formed in a reliable manner without causing the capacitor suffering from stresses caused by the flow of melted resin. Thus, no lead wires of the capacitor are twisted, protecting welded portions between the capacitor and the lead wires from tearing off from the associated terminal. Thus, the secondary resin section is formed to form the connector case in a highly reliable manner.

According to a still further aspect of the present invention, the secondary resin section is formed in a substantially cylindrical shape.

With the secondary resin section formed in the substantially cylindrical shape, the connector case can be assembled to the housing in a reliable manner at low cost.

According to a still further aspect of the present invention, forming the primary resin section includes enfolding and sealing the capacitor and the terminal together.

By molding the primary resin section so as to enfold and seal the terminal and the capacitor together, the capacitor is fixedly secured and supported in the primary resin section together with the terminal, resulting in a capability of protecting the capacitor from suffering from stresses caused by the flow of melted resin during the formation of the secondary resin. Thus, it becomes possible to provide the connector case in a highly reliable structure.

According to a still further aspect of the present invention, the metallic terminal includes a plurality of terminals which are integrally connected to each other through a bar portion, which is cut out to form the plurality of separate terminals.

Thus, the terminal component, in which the terminals are connected through the bar portion, can be prepared. The bar portion of the terminal component can be cut out to form the plural terminals of the primary resin section. Therefore, no displacement occurs in position of the plural terminals, which are consequently correctly located in the primary resin section, resulting in reliable operation of the connector case.

According to a still further aspect of the present invention, the terminal component is enfolded and sealed such that the bar portion is exposed.

Thus, by causing the terminal component to be molded with resin so as to expose the bar portion, the bar portion can be easily cut away after the formation of the primary resin section.

According to a still further aspect of the present invention, the terminal is enfolded and sealed such that both ends of the terminal are exposed and a plurality of fixing elements are formed so as to extend toward the capacitor to hold the same in a fixed place on the terminal;

With such a structure, a molding die of the primary resin section can be simplified in structure, resulting in reduction of cost. Further, the presence of the plural fixing elements allows the capacitor to be fixedly supported on the terminal in a reliable manner, resulting in the formation of a reliable connector case.

According to a still further aspect of the present invention, preparing the metallic terminal includes preparing the metallic terminal having an intermediate area formed with a fixing portion, and wherein connecting the capacitor to the terminal includes placing the capacitor on the fixing portion, and connecting the capacitor to the terminal through wirings such that the capacitor is fixed in the fixing portion.

Upon preparing the terminal with the fixing portion to support the capacitor thereon, the fixing portion can be formed upon press forming the terminal per se, resulting in simplification in manufacturing process. Further, a molding die for the primary resin section is simplified in structure, resulting in reduction in costs of the molding die.

BRIEF DESCRIPTION OF THE DRAWINGS

For a better understanding of the present invention and to show how the same may be carried into effect, there will now be described by way of example only, specific embodiments according to the present invention with reference to the accompanying drawings, in which.

DETAILED DESCRIPTION OF THE PREFERRED EMBODIMENTS (First Embodiment)

Figure 1:
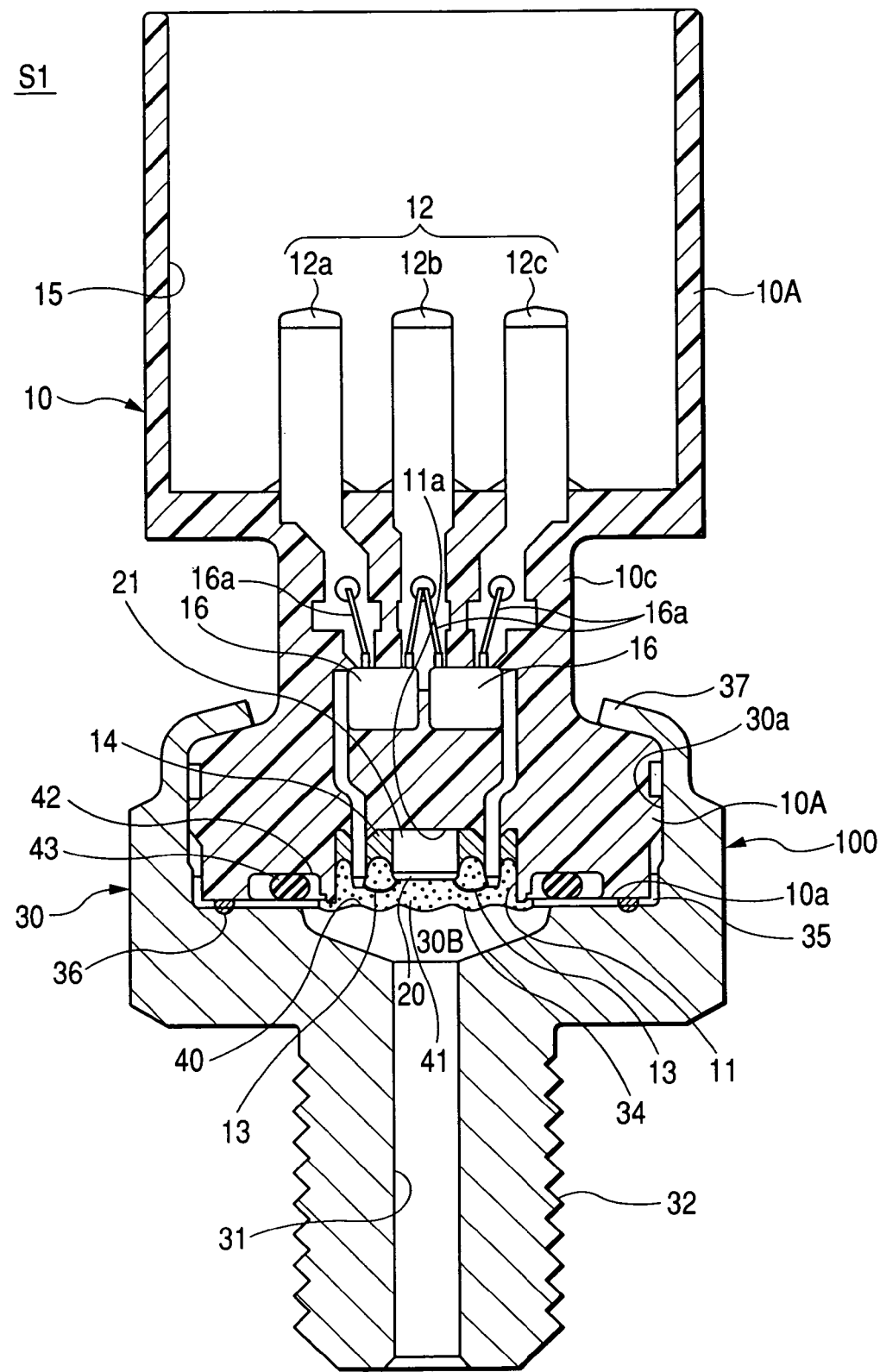
FIG. 1 is a schematic cross-sectional view of a pressure sensor of a first embodiment according to the present invention.

Hereinafter, a pressure sensor of an embodiment according to the present invention is described with reference to FIG. 1. FIG. 1 is a cross-sectional view of a pressure sensor S1 of the presently filed embodiment. It will be appreciated that the pressure sensor S1 is used in a location, under environments that are susceptible to electromagnetic waves, such as an engine room of a vehicle, for detecting a pressure of a combustion chamber of the engine. Also, the same component parts as those shown in FIG. 5 bear like reference numerals throughout the several views.

As shown in FIG. 1, the pressure sensor S1 is generally comprised of a casing 100 composed of a connector case 10 and a housing 30 connected to each other in a unitary structure. The housing 30 has a shoulder 30A, extending on a plane perpendicular to an axis of the housing 30, a pressure introduction bore 31, and a pressure chamber 30B defined adjacent to the shoulder 30A and communicating with the pressure introduction bore 31. The housing 30 is made of metal, such as aluminum, and has a threaded portion 32 through which the pressure sensor S1 is adapted for installation on an object, whose pressure is to be measured, of a vehicle.

The pressure sensor S1 also includes a metallic diaphragm 34, disposed between a distal end face 10a of the connector case 10 and the shoulder 30A of the housing 30, which has one surface exposed to the pressure chamber 30B and the other surface exposed to a pressure detection chamber 40 that is defined between the metallic diaphragm 34 and the connector case 10.

The connector case 10 includes a base 10A, having its one end pressed against the shoulder 30A of the housing 30 and the other end held in a fixed place by a caulked portion 37 of the housing 30, a plug case 10B accommodating therein a plurality of bar-like terminals 12, each made of metal, which involve a first terminal 12a through which electric power is supplied, a second terminal 12b through which an output signal is outputted to an outside of the pressure sensor S1, and a third terminal 12c serving as a ground terminal, and an intermediate section 10C formed between the base 10A and the plug case 10B.

As shown in FIG. 1, the connector case 10 is molded by die forming resin, such as PPS (polyphenylene sulfide) and PBT (polybutylene terephthalate) and, in the presently filed embodiment, takes the form of a substantially column-shaped configuration. The connector case 10, which serves as a resin case, has the base 10A whose one end is formed with a cavity 11.

The cavity 11 accommodates therein a pedestal 21, made of suitable materials such as glass, which is adhered to a bottom wall 11a of the cavity 11 and carries thereon a sensor element 20 that is unitized with the pedestal 21 by an anodic bonding process into a unitary structure that is fixedly mounted in the connector case 10.

The sensor element 20 is of a semiconductor diaphragm that has a surface formed with a diaphragm, serving as a pressure-receiving surface, on which a gauge resistor is mounted for converting a pressure exerted onto the diaphragm into an electric signal that is outputted as a sensor signal.

The terminals 12 are supported by the connector case 10 and has one end electrically connected to the sensor element 20 for interconnecting the sensor element 20 and an external circuitry.

With the presently filed embodiment, the terminals 12 are made of material composed of copper alloy treated with plating (such as plating or Ag plating) and fixedly retained in the connector case 10 upon insert molding to allow the connector case 10 to be unitarily formed with the terminals 12.

One distal end (at a lower end in FIG. 1) of each terminal 12 is configured so as to protrude from the bottom surface 11a of the cavity 11 in an area near a circumferential periphery of a region in which the sensor element 20 is mounted. On the other hand, the other end (at an upper end in FIG. 1) of each terminal 12 is exposed to an opening portion 15 of the plug case 10B.

As shown in FIG. 1, incorporated inside the intermediate section 10C of the connector case 10, made of resin, are capacitors 16 that serve as noise suppressors to eliminate noises, incoming from the terminals 12, from the pressure sensor S1 for thereby protecting the sensor element 20 from erroneous operations and include ceramic capacitors, respectively.

Figure 2A:
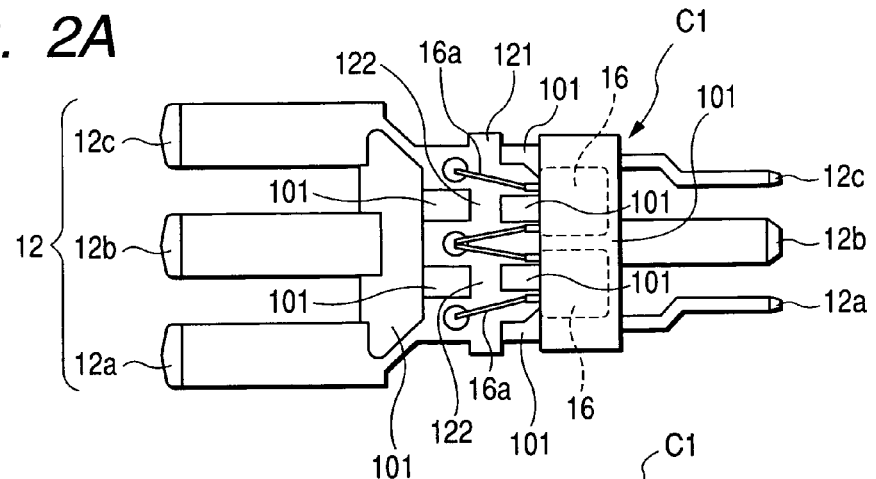
FIG. 2A is a plan view of a primary resin section illustrating method of manufacturing a connector case of the pressure sensor shown in FIG. 1.
Figure 2B:
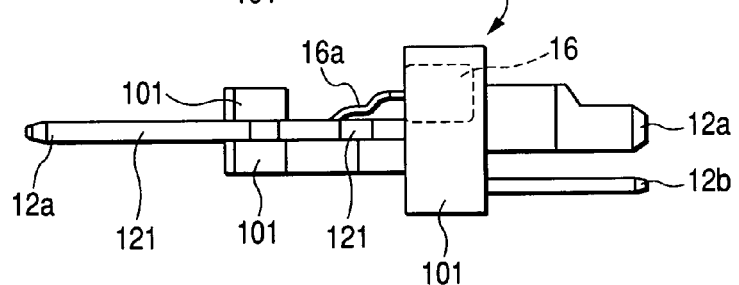
FIG. 2B is a side view of the primary resin section shown in FIG. 2A.

The capacitors 16 are connected to the associated terminals 12 by welding, respectively, and are encapsulated in a fixed place by resin by which the connector case 10 is formed. More particularly, one of the capacitors 16 is disposed between the electric power supply terminal 12a and the signal output terminal 12b and the other one of the capacitors 16 is disposed between the signal output terminal 12b and the ground terminal 12c as shown in FIGS. 2A and 2B. Also, a method of manufacturing in which capacitors 16 are connected to the terminals 12 in encapsulated manners will be described below in detail.

Further, the connector case 10, shown in FIG. 1, is comprised of a primary molded section 101, serving as a first resin section, through which the terminals 12 are fixedly retained, and a secondary formed section 102 serving as a second resin section that provides an outer profile of the connector case 10. That is, it is clearly apparent by appearance that the primary molded section 101 is encapsulated in the secondary formed section 102 as viewed in any arbitrary cross section of the connector case 10.

Figure 2C:
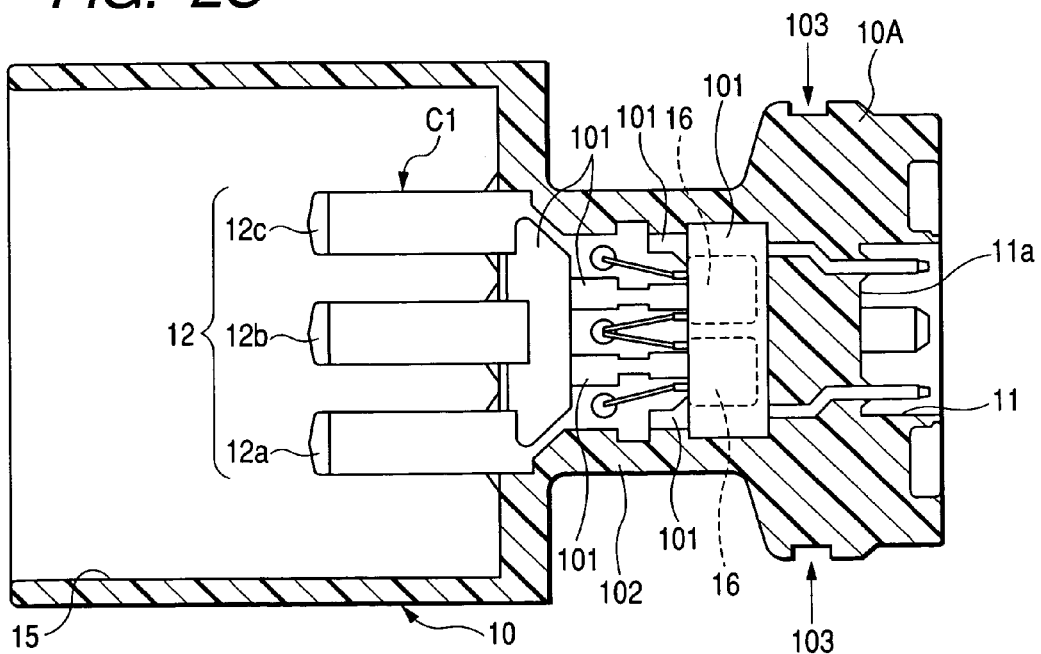
FIG. 2C is a cross-sectional view of the connector case forming part of the pressure sensor shown in FIG. 1.

As best shown in FIGS. 1 and 2C, one ends of the terminals 12 protrude into the cavity 11 of the base 10A of the connector case 10 and electrically connected to the sensor element 20 by respective bonding wires 13, such as gold or aluminum wires.

Further, fitted into a space between the cavity 11 and the pedestal 21 is sealing agent 14, which encapsulates root portions of the respective terminals 12 and the pedestal 21.

Turning back to FIG. 1, the plug case 10B of the connector case 10 has an opening section 15 that serves as a connector section through which the terminals 12 are electrically connected to the external circuitry (such as an ECU of a vehicle) via external wirings such as external wire harnesses (not shown).

That is, the other ends of the terminals 12 exposed to the opening section 15 of the plug case 10B are available to be electrically connected to the external circuitry through such a connector section. In such a way, the output signal generated by the sensor element 20 is delivered to the external circuitry through the bonding wires 13 and the terminals 12.

Further, as shown in FIG. 1, the base 10A of the connector case 10 is fixedly secured to the housing 30 by the caulked portion 37 thereof as previously described above. More particularly, the housing 30 is formed with a concave portion 30a to which the base 10A of the connector case 10 is inserted to allow the connector case 10 to be assembled to the housing 30.

This allows the connector case 10 and the housing 30 to be unitarily assembled to form the casing 100 in which the sensor element 20 is incorporated.

As set forth above, the metallic diaphragm 34, which is made of thin metal (such as stainless steel), is supported on the shoulder 30A of the housing to be exposed to the pressure chamber 30B. More particularly, the metallic diaphragm 34 is placed on the shoulder 30A and a press member (ring weld) 35, formed of a metallic annular sheet (such as SUS), is placed on a circumferential periphery of the metallic diaphragm 34.

With the presently filed embodiment, the circumferential periphery of the metallic diaphragm 34 is welded to the shoulder 30A together with the press member 35 by laser welding such that the metallic diaphragm 34, the press member 35 and the shoulder 30A of the housing 30 are fused to form a welded section 36 as shown in FIG. 1. The welded section 36 serves as a fixing section that allows the press member 35 and the shoulder 30A of the housing 30 to fixedly secure the metallic diaphragm 34 in a fixed place. Thus, the metallic diaphragm 34 is comprised of the press member 35.

Moreover, the one end of the base 10A of the connector case 10 has an annular recess 42, formed in a way to surround an outer periphery of the pressure detection chamber 40, in which a sealing member such as an O-ring 43 is disposed to seal the pressure detection chamber 40 in a gastight manner.

With such a structure set forth above, the caulked portion 37 of the housing 30 fixedly retains the other end of the base 10A of the connector case 10, whereby the pressure detection chamber 40 is defined between the metallic diaphragm 34 fixed to the shoulder 30A of the housing 30 and the cavity 11 of the base 10A of the connector case 10 and closed by the sealing member 43 in the gastight manner.

Filled into and sealed in the pressure detection chamber 40 is sealing liquid 41, serving as pressure transfer medium, which is composed of oil such as fluorine oil. That is, the cavity 11 is filled with oil 41 so as to conceal electrically connecting portions between the sensor element 20 and the wires 13, upon which the metallic diaphragm 34, the connector case 10 and the housing 30 conceal the cavity 11 to seal the same gastight.

With the pressure detection chamber 40 configured in such a structure, a pressure is introduced, as an object to be detected, into the pressure chamber 30A of the housing 30 through the pressure introduction bore 31 thereof. This pressure is applied to the pressure sensor 20, the bonding wires 13 and the terminals 12 inside the pressure detection chamber 40.

Now, a method of manufacturing the connector case 10 in which the capacitors 16 are incorporated and a method of manufacturing the pressure sensor S1, set forth above, are described below in detail. First, description is made of the method of manufacturing the connector case 10 in which the capacitors 16 are incorporated.

FIGS. 2A to 2C are views for illustrating the method of manufacturing the connector case 10. FIG. 2A is a plan view illustrating the primary molded section 101 with which the terminals 12 and the capacitors 16 are insert molded; FIG. 2B is a side view of the primary molded section 101 shown in FIG. 2A; and FIG. 2C is a cross sectional view illustrating the secondary formed section 102, serving as the connector case 10, in which the primary molded section 101 is molded. Also, it will be appreciated that the primary molded section 101 corresponds to the primary resin section and the secondary molded section 202 corresponds to the secondary resin section set forth above.

First, a metallic plate, made of copper alloy, is subjected to press forming to thereby form a terminal component 121 including the power supply terminal 12a, the signal output terminal 12b and the ground terminal 12c. With such a structure, the terminal component 121 has bar portions through which the respective terminals 12 are connected in a unitary structure.

In consecutive step, the terminal component 121 is subjected to plating. First, a whole of the terminal component 121 is plated with NiP. Subsequently, among the terminals 12, partial areas of the terminals 12 exposed to the opening section 15 of the connector case 10 are plated with Ag. That is, Ag plating is not carried on areas, to which lead wires 16a of the capacitors 16 are welded, of the terminals 12.

Then, the capacitors 16 are connected to the terminals 12, respectively. More particularly, the capacitors 16, such as ceramic capacitors, are prepared whose lead wires 16a are joined to given positions of the respective terminals 12 between the power supply terminal 12a and the signal output terminal 12b and between the signal output terminal 12b and the ground terminal 12c by welding.

Next, the primary molded section 101 is formed at a given position of the terminal component 121 by molding with resin such as PPS. In particular, the terminal component is placed in a molding die into which melted resin is poured and hardened, thereby forming the primary molded section 101 on the terminal component 101. This enables the primary molded section 101 to reliably retain the capacitors 16 in fixed places. Also, the bar portions 122 of the terminal component 121 are configured not to be covered with resin.

Thereafter, the bar portions 122, through which the respective terminals 12 are connected, are cut out for removal. This allows the respective terminals 12 to be electrically separate from each other.

In succeeding step, the resin molding is carried out to form secondary formed section 102 as the connector case 10. More particularly, after the capacitors 16 are placed on the terminal component 121 and insert molding is carried out to form the primary molded section 101 as shown in FIGS. 2A and 2B, the terminals 12, on which the primary molded section 101 is formed, are set in a molding die for the connector case 10 upon which melted resin is poured into the molding die through resin inlet ports 103 to form the secondary formed section 102 as the connector case 10 as shown in FIG. 2C. In such a way, the manufacturing process is completed to form the connector case 10 containing the capacitors 16.

Next, the method of manufacturing the pressure sensor S1 set forth above is described. First, the connector case 10 containing capacitors as shown in FIG. 2C is prepared. Then, the sensor element 20 is adhered to and fixedly secured onto the cavity 11 of the base 10A of the connector case 10 via the pedestal 21 using adhesive such as one composed of silicone resin.

Consecutively, seal agent is poured into the cavity 11 to allow the seal agent 14 to spread to surrounding areas of the respective terminals 12 and then hardened. Next, wire bonding is carried out to connected the distal ends of the protruding portions of the respective terminals 12 to the sensor element 20 by the wires 13, thereby providing electrical connections.

Then, the connector case 10 is positioned with the sensor element 20 placed upward and a fixed amount of oil 41, such as fluorine oil, is injected to the cavity 11 using a dispenser.

In succeeding step, the metallic diaphragm 34 and the press member 35 are placed on the shoulder 30A of the housing 30 and, thereafter, a given voltage is applied across the metallic diaphragm 34 and the housing 30. When this takes place, a circumferential periphery of the metallic diaphragm 34 is fused to the shoulder 30A of the housing 30 by resistance welding, thereby forming the housing 30 to the shoulder 30A of which the metallic diaphragm is welded at an entire circumference thereof.

Subsequently, the housing 30, to the concave portion 30a of which the metallic diaphragm 34 and the press member 35 are welded at their entire circumferences, is prepared and is lowered while keeping the housing 30 in a horizontal position until the housing 30 is fitted to the connector case 10. A unitary structural body under such a condition is placed on an evacuated chamber for evacuation, thereby removing excessive air from the pressure detection chamber 40.

Thereafter, the connector case 10 and the press member 35 are pressed to be sufficiently brought into contact with each other, thereby forming the pressure detection chamber 40 that is sealed by the metallic diaphragm 34 and the O-ring 42.

Then, the one end of the housing 30 is caulked toward the base 10A of the connector case 10, thereby forming the caulked portion 37. In such a way, unitizing the connector case 10 and the housing 30 with the caulked portion 37 allows the connector case 10 and the housing 30 to be assembled and fixedly secured to each other. Further, forming the caulked portion 37 presses the connector case 10 in a direction to insert the same toward the concave portion 30a of the housing 30 whereby the pressure detection chamber 40 is closed to maintain a seal structure between the metallic diaphragm 34 and the housing 30. Thus, the pressure sensor S1 is completed in a structure as shown in FIG. 1.

Basic pressure detecting operations of the pressure sensor S1 with such a structure set forth above are described below.

The pressure sensor S1 is mounted to an engine room of a vehicle by means of the threaded portion 32 of the housing 30 in a manner as set forth above. Under such a condition, a pressure in a combustion chamber of the engine room is introduced through the pressure introduction bore 31 to the pressure chamber 30B of the housing 30 forming the pressure sensor S1.

Then, the introduced pressure is applied to the metallic diaphragm 34 upon which the pressure is further exerted to the surface, that is, the pressure-receiving surface, of the sensor element 20 via oil 41 inside the pressure detection chamber 40. Then, the sensor element 20 outputs an electric signal depending on the magnitude of the applied pressure as a sensor signal.

The sensor signal is delivered from the sensor element 20 to the external circuit set forth above via wires 13 and the terminals 12 for detection of the pressure inside the combustion chamber. In such a way, the pressure sensor S1 executes the pressure detection.

Next, description is made of a path in which noises are inputted to and outputted from the pressure sensor S1. The noises transfer through wirings of a connector, to which the connector case 10 is connected, and are inputted to the pressure sensor S1 through the respective terminals 12. That is, there is a possibility for the noises to be inputted through any of the power supply terminal 12a, the signal output terminal 12b and the ground terminal 12c.

In cases where the noises are inputted through the power supply terminal 12a, the noises pass through the capacitors 16 disposed between the power supply terminal 12a and the signal output terminal 12b and between the signal output terminal 12b and the ground terminal 12c to the ground terminal 12c, upon which the noises are outputted to the outside of the pressure sensor S1 via the housing 30.

Further, in cases where the noises are inputted through the signal output terminal 12b, the noises pass through the capacitor 16 disposed between the signal output terminal 12b and the ground terminal 12c to the ground terminal 12c, upon which the noises are outputted to the outside of the pressure sensor S1 via the housing 30.

Also, the noises inputted to the ground terminal 121c hardly affect performance of the pressure sensor S1.

In such a way, the noises inputted to the pressure sensor S1 can be removed from the pressure sensor S1 due to functions of the capacitors 16 incorporated in the connector case 10. As a consequence, erroneous operations of the sensor element 20 of the pressure sensor S1 can be prevented.

As set forth above, with the pressure sensor S1 set forth above, the capacitors 16 are held in respective fixed places by the primary molded section 101. Thus, retaining the capacitors 16 in the primary molded section 101 enables the provision of a structure by which the capacitors 16 suffer no stresses caused by flow of resin during the formation of the secondary formed section 102 for structuring the connector case 10. When this takes place, forming the primary molded section 101 in a way to enfold the capacitors 16 provides a structure wherein the capacitors 16 are reliably fixed in positions. Accordingly, no probability occurs for the lead wires 16a of the capacitors 16 to suffer stresses during the formation of the secondary formed section 102 with no occurrence for the lead wires 16a to twist, thereby enabling welded portions between the lead wires 16a and the terminals 12 to be prevented from damages.

Thus, the capacitors 16, incorporated in the connector case 10, are maintained to be electrically connected to the respective terminals 12 and the noises inputted to the pressure sensor S1 are outputted to the outside of the pressure sensor S1 by means of the capacitors 16 to which the respective terminals 12 are connected. Therefore, an internal part, that is, the sensor element 20, of the pressure sensor S1 can be protected from noises.

Additionally, the terminal component 121 is plated with suitable materials such as NiP or Ag. Thus, by plating the terminal component 121, metal of the terminal component 121 can be protected from corrosions, enabling an external circuit and the sensor element 20 of the pressure sensor S1 to be electrically connected to each other in a reliable fashion.

Moreover, during the formation of the primary molded section 101, forming the primary molded section 101 in a way to allow the bar portions 122, through which the respective terminals 12 are connected, to be exposed provides the ease of cutting out the bar portions 122 after forming the primary molded section 101. Then, cutting out the bar portions 122 enables the respective terminals 12 to be electrically disconnected from each other.

(Other Embodiments)

While the first embodiment has been described in conjunction with an exemplary case wherein the capacitors 16 are disposed between the power supply terminal 12a and the signal output terminal 12b and between the signal output terminal 12b and the ground terminal 12c, no limitation is intended to the particular number of capacitors 16 and a particular connecting pattern disclosed in the first embodiment. For instance, an alternative may include only one capacitor that is disposed between the power supply terminal 12a and the ground terminal 12c. In such an alternative, noises inputted from the power supply terminal 12a flow through the capacitor 16 to the ground terminal 12c, upon which the noises are outputted from the pressure sensor S1.

Also, while the first embodiment has been disclosed with reference to an exemplary structure wherein the capacitors 16 are enfolded and sealed by the primary molded section 101 when connecting and fixing the capacitors 16 to the respective terminals 16, such particular arrangement is meant to be illustrative only and not limiting to the invention. That is, another method, in which the primary molded section 101 does not encapsulate and seal the capacitors 16, may be employed for the capacitors 16 to be fixedly secured by the primary molded section 101. Hereunder, examples of a method of fixedly securing the capacitors 16 by the primary molded section 101 are described with reference to FIGS. 3A and 3B and FIGS. 4A to 4C.

Figure 3A:
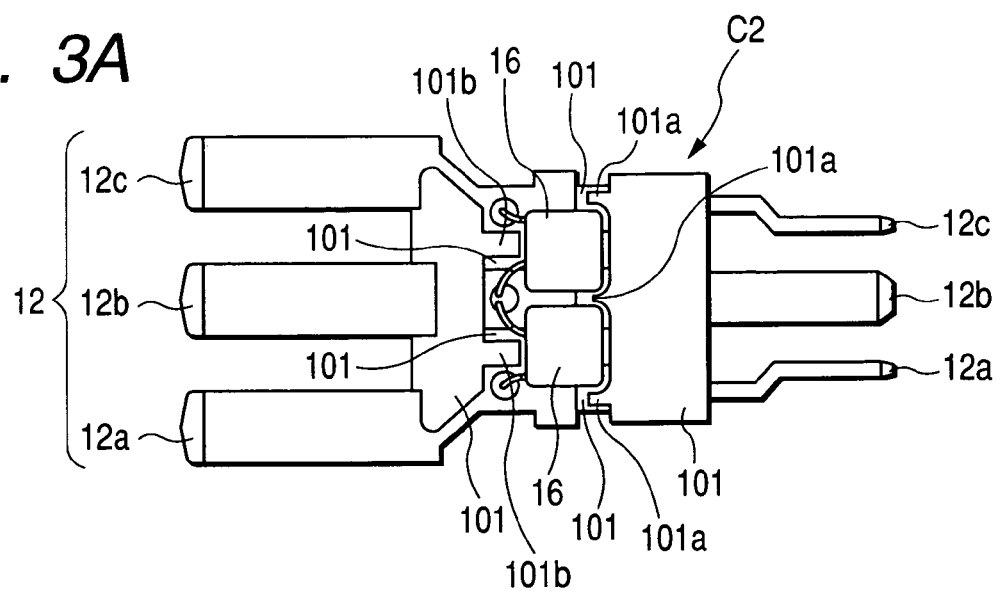
FIG. 3A is a plan view illustrating a modified form of the primary resin section shown in FIGS. 2A and 2B.
Figure 3B:
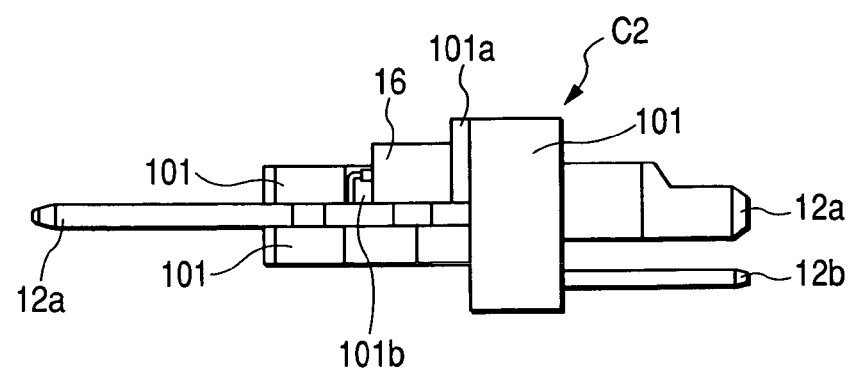
FIG. 3B is a side view of the primary resin section shown in FIG. 3A.

FIG. 3A is a plan view of a connector section C2 of a modified form of the first embodiment, and FIG. 3B is a side view of the connector section C2 shown in FIG. 3A. As shown in FIGS. 3A and 3B, the primary molded section 101 includes first and second support bodies 101A, 101B fixedly holding the terminals at respective intermediate areas thereof and formed with a plurality of protrusions 101a and a plurality of protrusions 101b, respectively, both of which serve as fixing elements to retain the capacitors in fixed places. More particularly, the first support body 101A has laterally spaced three protrusions 101a with plural indents formed to accommodate one side of the capacitors 16. Likewise, the second support body 101B has laterally spaced two protrusions 101b each of which extends to a position between the wirings 16a of each capacitor 16 such that bottom walls of the protrusions 101b are located closer to the other ends of the capacitors 16. With such a structure, the capacitors 16 are fixedly supported by the first and second support bodies 101A and 101B in respective fixed positions on the terminals 12 by means of the protrusions 101a, 101b. Therefore, the primary molded section 101 is formed in such a structure with the first and second support bodies 101A, 100B formed with respective protrusions 101a, 101b and, thereafter, the capacitors 16 are joined to the terminals 12 by the wires 16a. Thus, by forming the primary molded section 101 with the first and second support bodies 101A, 101B formed with respective protrusions 101a, 101b to allow the respective protrusions 101a, 101b to fixedly secure the capacitors 16, the capacitors 16 can be reliably fixed in positions when forming the secondary formed section with resin to completely form the connector case.

Figure 4A:
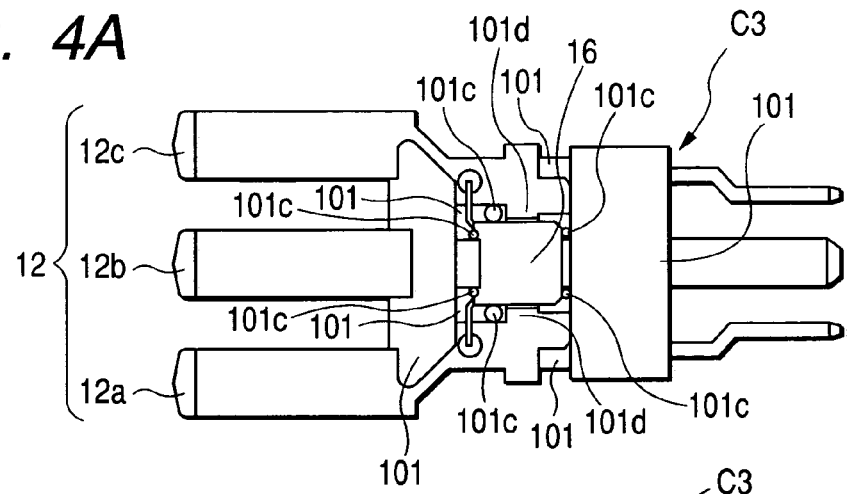
FIG. 4A is a plan view illustrating another modified form of the primary resin section shown in FIGS. 2A and 2B.
Figure 4B:
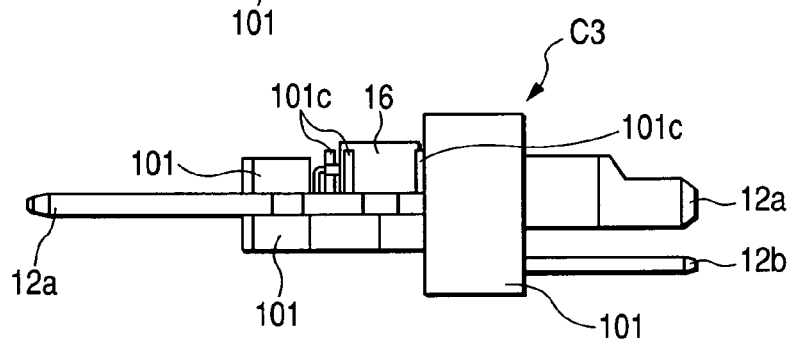
FIG. 4B is a side view of the primary resin section shown in FIG. 4A.

Further, as previously mentioned above, there is a probability for only one capacitor 16 to be provided for the terminals 12. FIG. 4A is a plan view showing a connector section C3 of another modified form of the first embodiment according to the present invention and FIG. 4B is a side view of the connector section C3 shown in FIG. 4A. In this modified form, the primary molded section 101 has plural struts 101c, extending on a plane perpendicular to a surface of each terminal 12 at first positions adjacent to both side faces of the capacitor 16 and second positions adjacent to a bottom surface of the capacitor 16, by which the capacitor 16 is fixedly retained. In addition, the primary molded section 101 has an intermediate area formed with laterally and inwardly extending protrusions 101d between which both sides of the capacitor 16 are sandwiched and fixed in position.

With the structure of the connector section C3 shown in FIGS. 4A and 4B, forming the primary molded section 101 with the plural struts 101c allows the capacitor 16 to be fixedly retained, and the secondary formed section can be unitized with the primary molded section 101 during die molding without causing deviation of the capacitor 16 from a correct position.

Figure 5A:
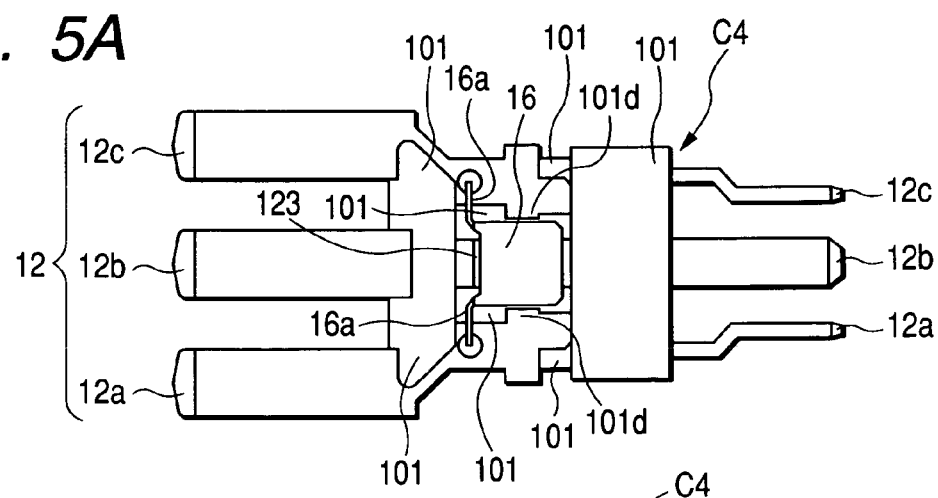
FIG. 5A is a plan view illustrating another modified form of the primary resin section shown in FIGS. 2A and 2B.
Figure 5B:
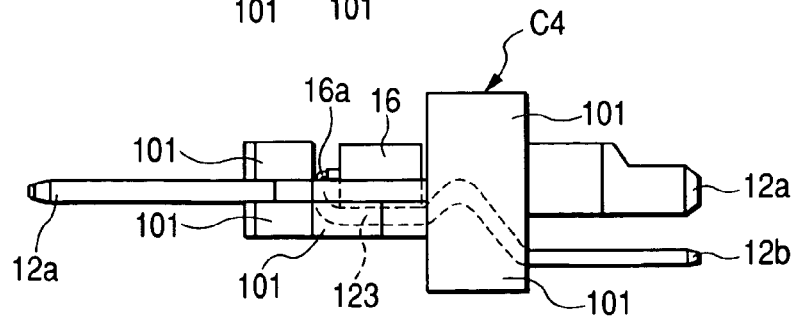
FIG. 5B is a side view of the primary resin section shown in FIG. 5A.
Figure 6A:
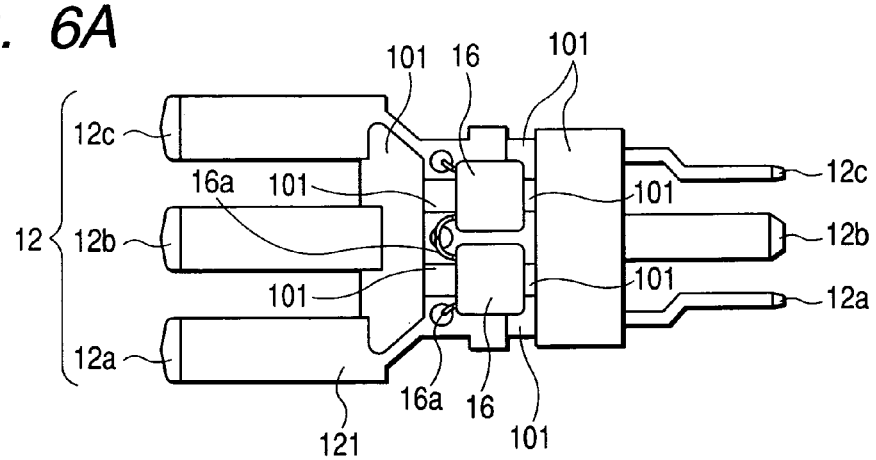
FIG. 6A is a plan view illustrating a primary resin section forming part of a pressure sensor of the related art.
Figure 6B:
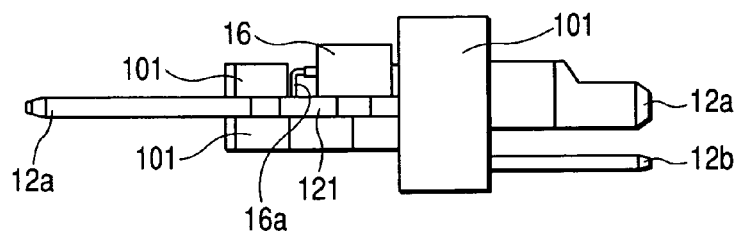
FIG. 6B is a side view of the primary resin section shown in FIG. 6A.
Figure 6C:
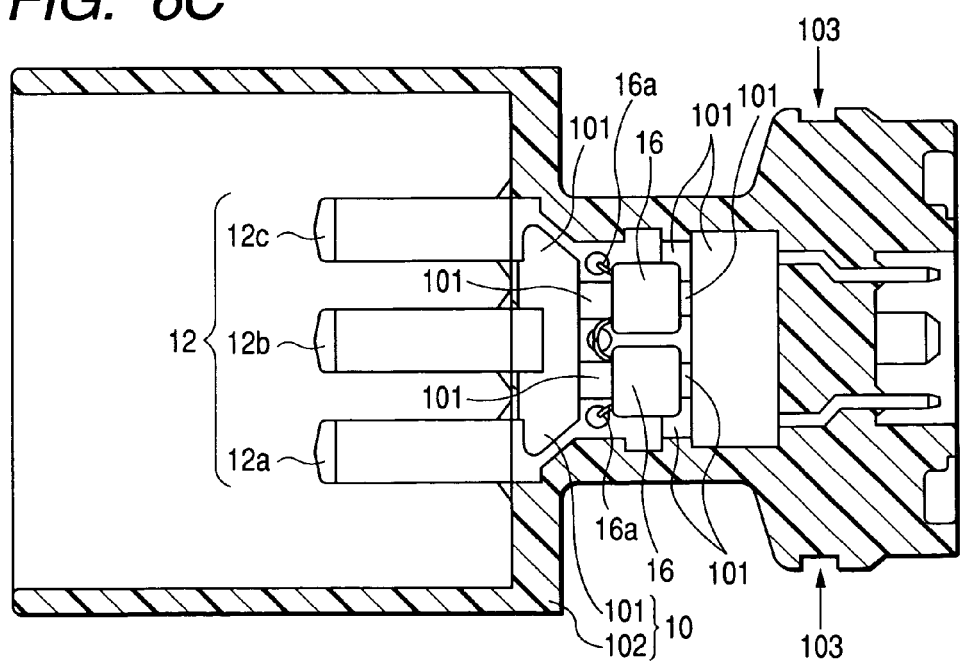
FIG. 6C is a cross-sectional view of a connector case of the pressure sensor employing the primary resin section shown in FIGS. 6A and 6B.

FIG. 5A is a plan view showing a connector section C4 of still another modified form of the first embodiment and FIG. 5B is a side view of the connector section C4 shown in FIG. 5A. In the modified form shown in FIGS. 5A and 5B, among the terminals 12, the signal output terminal 12b has an intermediate area formed with a concave portion 123, serving as a fixing portion, on which a lower surface of the capacitor 16 rests and is held in a fixed place. The concave portion 123 of the signal output terminal 12b is formed when forming the terminal component 121 by bending work. Also, the both sides of the capacitor 16 are sandwiched and fixedly retained by the projections 101d of the primary molded section 101. Under such a condition, the capacitor 16 is wire bonded to the power supply terminal 12a and the ground terminal 12c by the wires 16a with a lower surface of the capacitor 16 resting on the concave portion 123 of the signal output terminal 12b. This results in a capability for the capacitor 16 to resist the flow of resin during molding process. Thus, the primary molded section 101 can be reliably unitized with the secondary formed section during a subsequent molding process without causing the deviation of the capacitor 16.

As set forth above, while the various embodiments of the present invention has been described with reference to the particular implementation wherein the pressure detection chamber 40 is filled with oil 41, the present invention is not limited to such a particular structure and the pressure detection chamber 40 may not be filled with oil. That is, the pressure detection chamber 40 may be sufficed to apply a measuring pressure to the sensor element 20 via the metallic diaphragm 34 and, to this end, pressure transfer medium in the pressure detection chamber 40 may include gas or the like.

Further, material of the housing 30 is not limited to metal and may include other material depending on needs.

Also, the sensor element 20 is not limited to the semiconductor diaphragm type that converts the pressure exerted to the diaphragm to the electric signal that is outputted as the sensor signal.

While the specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention, which is to be given the full breadth of the following claims and all equivalents thereof.

What is claimed is:

1. A pressure sensor comprising:
a connector case carrying thereon an electrically conductive terminal;
a housing adapted to be supplied with a pressure to be detected and fixedly carrying thereon the connector case;
a capacitor supported by the connector case and connected to the terminal to allow noises, inputted through the terminal, to be outputted to an outside; and
a sensor section mounted to the connector case at one end thereof for detecting the pressure introduced to the housing to deliver a pressure detection signal through the terminal;
wherein the connector case includes a primary resin section, fixedly supporting the capacitor and the terminal, and a second resin section by which a joint area between the terminal and the capacitor and the primary resin section are enfolded and sealed.

2. The pressure sensor according to claim 1, wherein:
the secondary resin section is formed in a substantially cylindrical shape; and
the capacitor and the terminal are enfolded and sealed in the primary resin section in a way to allow both ends of the terminal to be exposed outside.

3. The pressure sensor according to claim 1, wherein:
the secondary resin section is formed in a substantially cylindrical shape;
the terminal is enfolded and sealed in the primary resin section in a way to allow both ends of the terminal to be exposed outside; and
the capacitor is fixedly supported on the terminal by the primary resin section.

4. The pressure sensor according to claim 3, wherein:
the first resin section has a plurality of fixing elements extending toward the capacitor to hold the same in a fixed place on the terminal.

5. The pressure sensor according to claim 4, wherein:
the fixing elements include protrusions extending from the first resin section at positions adjacent the capacitor, respectively.

6. The pressure sensor according to claim 4, wherein:
the fixing elements include struts extending from the first resin section at positions adjacent the capacitor.

7. The pressure sensor according to claim 3, wherein:
the terminal has a fixing portion by which the capacitor is held in a fixed place.

8. The pressure sensor according to claim 7, wherein:
the fixing portion includes a concave portion on which the capacitor rests and is held in the fixed place.

9. The pressure sensor according to claim 1, further comprising:
a diaphragm disposed between the one end of the connector case and the housing and having one surface, exposed to the pressure applied to the housing, and the other surface facing the sensor section to apply the pressure thereto.

10. The pressure sensor according to claim 9, further comprising:
a pressure detection chamber exposed to the other surface of the diaphragm; and
a pressure transfer medium filled in the pressure detection chamber to transfer the pressure, applied to the diaphragm, to the sensor section.

11. The pressure sensor according to claim 10, wherein:
the sensor section is mounted to the one end of the connector member and exposed to the pressure transfer medium; and
the terminal has one end exposed to the pressure detection chamber and electrically connected to the sensor section.

12. A pressure sensor comprising:
a connector case carrying thereon an electrically conductive terminal;
housing means adapted to be supplied with a pressure to be detected and fixedly carrying thereon the connector case;
capacitor means supported by the connector case and connected to the terminal to allow noises, inputted through the terminal, to be outputted to an outside; and
sensor means mounted for detecting the pressure introduced to the housing means to deliver a pressure detection signal through the terminal;
wherein the connector case includes a primary resin section, fixedly supporting the capacitor means and the terminal, and a second resin section by which the primary resin section is enfolded and sealed.

13. A method of manufacturing a pressure sensor, the method comprising:
preparing a metallic terminal;
connecting a capacitor to the terminal for allowing noises, inputted from the terminal, to be outputted to an outside;
forming a primary resin section such that the capacitor and the terminal are fixedly supported; and
forming a secondary resin section to enfold and seal the primary resin section and a joint area between the terminal and the capacitor such that both ends of the terminal are exposed.

14. The method of manufacturing a pressure sensor according to claim 13, wherein:
the secondary resin section is formed in a substantially cylindrical shape.

15. The method according to claim 13, wherein forming the primary resin section includes:
enfolding and sealing the capacitor and the terminal together.

16. The method according to claim 13, wherein the metallic terminal includes a plurality of terminals;
wherein preparing the metallic terminal includes:
preparing a terminal component integrally formed with the plurality of terminals through a bar portion; and
cutting the bar portion to form the plurality of separate terminals.

17. The method according to claim 16, wherein forming the primary resin section includes:
enfolding and sealing the terminal component such that the bar portion is exposed.

18. The method according to claim 13, wherein forming the primary resin section includes:
enfolding and sealing the terminal such that both ends of the terminal are exposed; and
forming a plurality of fixing elements that extend toward the capacitor to hold the same in a fixed place on the terminal.

19. The method according to claim 13, wherein preparing the metallic terminal includes:
preparing the metallic terminal having an intermediate area formed with a fixing portion; and
wherein connecting the capacitor to the terminal includes:
placing the capacitor on the fixing portion; and
connecting the capacitor to the terminal through wirings such that the capacitor is fixed in the fixing portion.

* * * * *